(12) United States Patent
Hsieh

(10) Patent No.: US 9,530,867 B2
(45) Date of Patent: Dec. 27, 2016

(54) METHOD FOR MANUFACTURING A SUPER-JUNCTION STRUCTURES HAVING IMPLANTED REGIONS SURROUNDING AN N EPITAXIAL LAYER IN DEEP TRENCH

(71) Applicant: Force Mos Technology Co., Ltd., New Taipei (TW)

(72) Inventor: Fu-Yuan Hsieh, New Taipei (TW)

(73) Assignee: FORCE MOS TECHNOLOGY CO., LTD. (TW)

( * ) Notice: Subject to any disclaimer, the term of this patent is extended or adjusted under 35 U.S.C. 154(b) by 0 days.

(21) Appl. No.: 14/799,878

(22) Filed: Jul. 15, 2015

(65) Prior Publication Data

US 2015/0318379 A1 Nov. 5, 2015

Related U.S. Application Data

(62) Division of application No. 14/031,089, filed on Sep. 19, 2013, now Pat. No. 9,099,320.

(51) Int. Cl.
| | | |
|---|---|---|
| H01L 21/336 | (2006.01) | |
| H01L 29/66 | (2006.01) | |
| H01L 29/06 | (2006.01) | |
| H01L 29/78 | (2006.01) | |
| H01L 21/3065 | (2006.01) | |
| H01L 21/321 | (2006.01) | |
| H01L 21/28 | (2006.01) | |

(Continued)

(52) U.S. Cl.
CPC ... *H01L 29/66734* (2013.01); *H01L 21/28035* (2013.01); *H01L 21/3065* (2013.01); *H01L 21/3212* (2013.01); *H01L 21/32137* (2013.01); *H01L 29/0619* (2013.01); *H01L 29/0634* (2013.01); *H01L 29/7811* (2013.01); *H01L 29/7813* (2013.01); *H01L 21/26586* (2013.01); *H01L 29/1095* (2013.01); *H01L 29/41766* (2013.01); *H01L 29/66727* (2013.01); *H01L 29/872* (2013.01)

(58) Field of Classification Search
CPC .......... H01L 51/56; H01L 33/32; H01L 33/62; H01L 51/0072; H01L 2251/558
USPC .......................................................... 438/270
See application file for complete search history.

(56) References Cited

U.S. PATENT DOCUMENTS

| | | | | |
|---|---|---|---|---|
| 8,067,800 B2 * | 11/2011 | Hsieh | ................... | H01L 29/0634 257/331 |
| 2012/0061754 A1 * | 3/2012 | Hsieh | ................... | H01L 29/0634 257/331 |

(Continued)

*Primary Examiner* — Andy Huynh
(74) *Attorney, Agent, or Firm* — Bacon & Thomas, PLLC

(57) ABSTRACT

A method for manufacturing a super junction trench MOSFET by growing a first epitaxial layer of a first conductivity type upon a heavily doped substrate layer of a first conductivity type; forming a deep trench mask covering a top surface of the first epitaxial layer; applying a trench mask to form a deep trench extending into the substrate layer by successively dry oxide etch and dry silicon etch; and carrying out angle ion implantations of the first conductivity type dopant and driving-in to form a first type column regions with column shape within the first epitaxial layer; and carrying out angle ion implantations of a second conductivity type dopant and diffusion to form a second type column regions with column shape adjacent to sidewalls of the deep trench, in parallel with and surrounding the first type column regions; and removing the hard mask.

3 Claims, 15 Drawing Sheets

(51) Int. Cl.
*H01L 21/3213* (2006.01)
*H01L 21/265* (2006.01)
*H01L 29/417* (2006.01)
*H01L 29/10* (2006.01)
*H01L 29/872* (2006.01)

(56) References Cited

U.S. PATENT DOCUMENTS

2014/0213023 A1* 7/2014 Lin .................. H01L 29/66477
　　　　　　　　　　　　　　　　　　　　438/197
2014/0346593 A1* 11/2014 Hsieh ................. H01L 29/7813
　　　　　　　　　　　　　　　　　　　　257/334

* cited by examiner

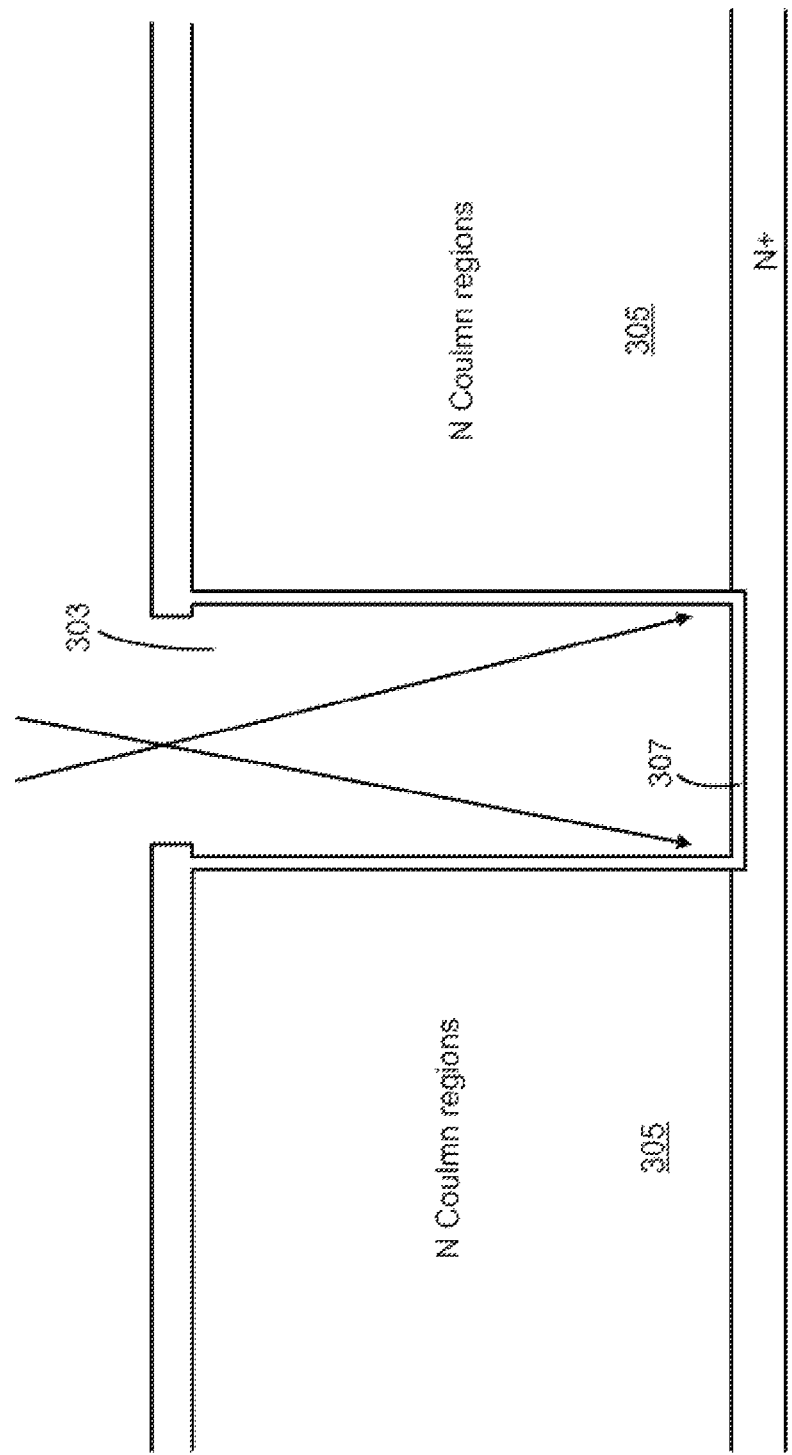

METHOD FOR MANUFACTURING A SUPER-JUNCTION STRUCTURES HAVING IMPLANTED REGIONS SURROUNDING AN N EPITAXIAL LAYER IN DEEP TRENCH

FIELD OF THE INVENTION

This invention relates generally to the cell structure, device configuration and fabrication process of power semiconductor devices. More particularly, this invention relates to a novel and improved cell structure, device configuration and improved process of super-junction structures.

BACKGROUND OF THE INVENTION

Super-junction structures are more and more attractive due to higher breakdown voltage and lower specific Rds (drain-source resistance). As is known to all, a super-junction structure is implemented by p type column structures and n type column structures arranged in parallel and connecting to each other onto a heavily doped substrate, however, the manufacturing yield is not stable because the super-junction structure is very sensitive to the fabrication processes and conditions such as: the p type column structures and n type column structures dopant re-diffusion issue induced by subsequent thermal processes; trapped charges within the column structures, etc. . . . . All that will cause a hazardous condition of charges imbalance to the super-junction structure. More specifically, these undesired influences become more pronounced with a narrower column structure width for a lower bias voltage ranging under 200V.

U.S. Pat. No. 7,601,597 disclosed a method to avoid the aforementioned p type column structure and n type structure dopant re-diffusion issue, for example, in an N-channel super-junction trench MOSFET (Metal Oxide Semiconductor Field Effect Transistor, the same herein after) as shown in FIG. 1, by setting up the p type column formation process in a deep trench at a last step after all diffusion processes such as: sacrificial oxidation after trench etch, gate oxidation, P body region formation and n+ source region formation, etc have been finished.

However, in order to achieve a shorter growth time of the p type epitaxial layer without having void formation in the deep trenches, a greater CD (Critical Dimension) is required, e.g., trench width of the deep trench must be greater than 4.0 um if the deep trench having 40 um depth. On the other hand, the deep trench filled with p type epitaxial layer and having a greater trench width will occupy a large amount of active areas, causing high specific Rds.

Moreover, other factors such as: the charges imbalance caused by the trapped charges within the column structure is still not resolved.

Therefore, there is still a need in the art of the semiconductor power device, particularly for super-junction design and fabrication, to provide a novel cell structure, device configuration that would resolve these difficulties and design limitations.

SUMMARY OF THE INVENTION

The present invention provides a super junction structure having implanted regions surrounding an N epitaxial layer in a deep trench to resolve the problems discussed above, wherein the implanted regions are P and N type column regions, which are formed by angle implantation through sidewalls of the deep trench into an N epitaxial layer on an N+ substrate. Therefore, the deep trench filled with the N type epitaxial layer surrounded with the P and N type column regions forms a charge balance area for sustaining high breakdown voltage. Furthermore, since the deep trench filled with the N type epitaxial layer, the specific Rds is significantly reduced because channel regions are capable of forming in the N type epitaxial layer in the deep trench. The inventive super junction structure can be used for power semiconductor power devices, such as: MOSFET and Schottky rectifier.

According to one aspect, the present invention features a super junction structure comprising: a first epitaxial layer of a first conductivity type formed on a substrate layer of the same conductivity type, wherein the first epitaxial layer has a lower doping concentration than the substrate layer; a deep trench penetrating through the first epitaxial layer and extending into the substrate layer; a second epitaxial layer of the first conductivity type formed in the deep trench; a first type column regions of the first conductivity type formed in the first epitaxial layer; a second type column regions of a second conductivity type formed in the first epitaxial layer and close to the first type column regions, surrounding the deep trench and arranged in parallel with the first type column regions and the deep trench.

According to another aspect, the present invention features a super junction structure integrated with a trench MOSFET structure, further comprising: a body region of the second conductivity type extending over the super junction structure; a plurality of trenched gates penetrating through the body region and extending into the first type column regions and the second epitaxial layer; at least one trenched source-body contact structure located between every two adjacent of the trenched gates; a source region of the first conductivity type extending between the trenched source-body contact structure and the adjacent trenched gate.

According to another aspect of the present invention, the inventive super junction structure integrated with the trench MOSFET structure further comprises a termination structure surrounding outer of the super junction structure and the trench MOSFET structure, wherein the termination structure further comprises multiple guard rings formed near surface of the first epitaxial layer to sustain a high breakdown voltage.

According to another aspect of the present invention, the inventive super junction structure integrated with the trench MOSFET structure further comprises a charge balance termination structure surrounding outer of the super junction structure and the trench MOSFET structure, wherein the charge balance termination structure further comprises a trenched EPR (equal potential ring) contact structure connecting the first epitaxial layer to an EPR metal layer, wherein the trenched EPR contact structure has sidewalls surrounded by a channel stop region of the first conductivity type in the first epitaxial layer.

The invention also features a method of making a super junction trench MOSFET including: (a) growing a first epitaxial layer of a first conductivity type upon a heavily doped substrate layer of the first conductivity type; (b) forming a deep trench mask covering a top surface of the first epitaxial layer; (c) applying a trench mask to form a deep trench extending into the substrate layer by successively dry oxide etch and dry silicon etch; (d) carrying out angle ion implantations of the first conductivity type dopant and driving-in to form a first type column regions with column shape within the first epitaxial layer; (e) carrying out angle ion implantations of a second conductivity type dopant and diffusion to form a second type column regions with column shape adjacent to sidewalls of the deep trench, in parallel with and surrounding the first type column regions; and (f) removing said hard mask.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIGS. 6A-6J are a serial of side cross-sectional views for showing the processing steps for fabricating the super junction trench MOSFET as shown in FIG. 3.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
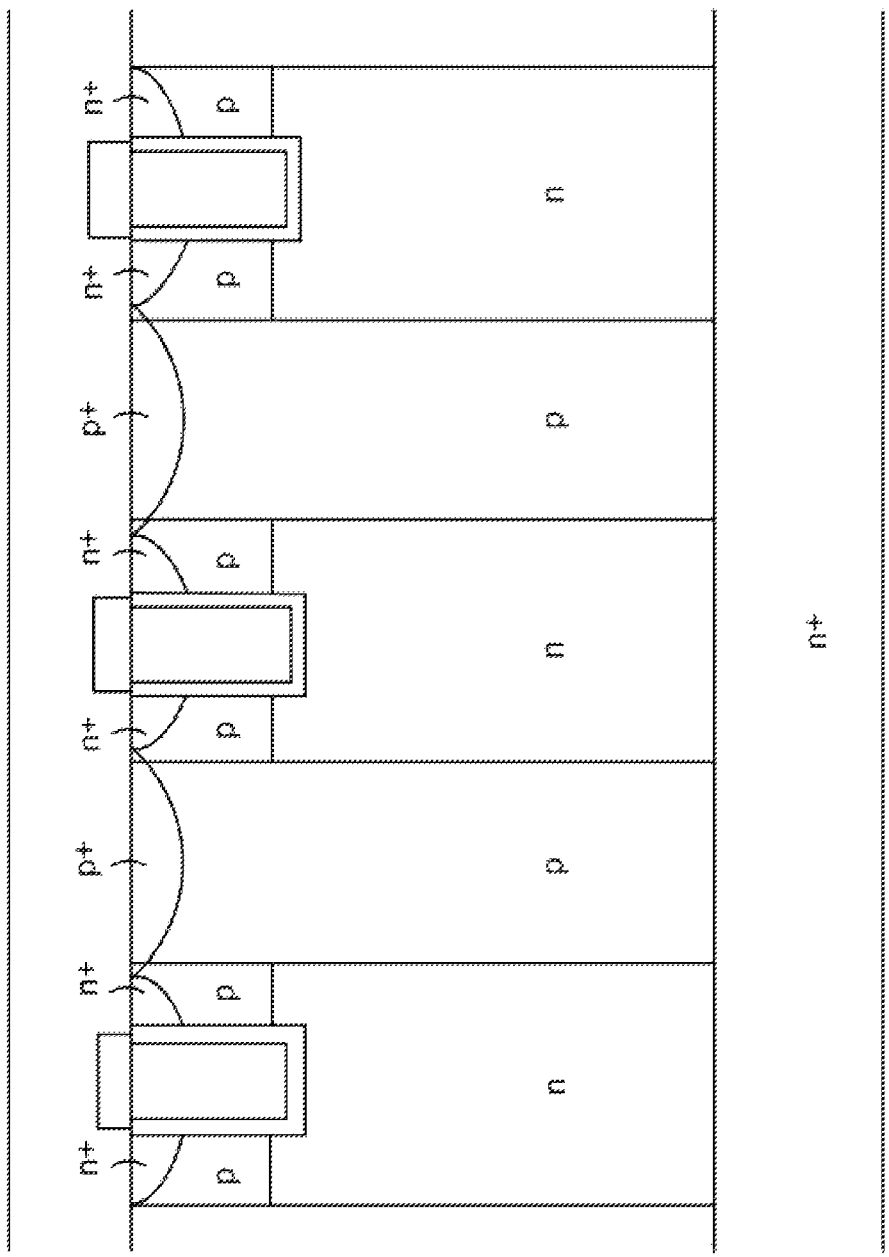
FIG. 1 is a cross-sectional view of a super junction of prior art.
Figure 2:
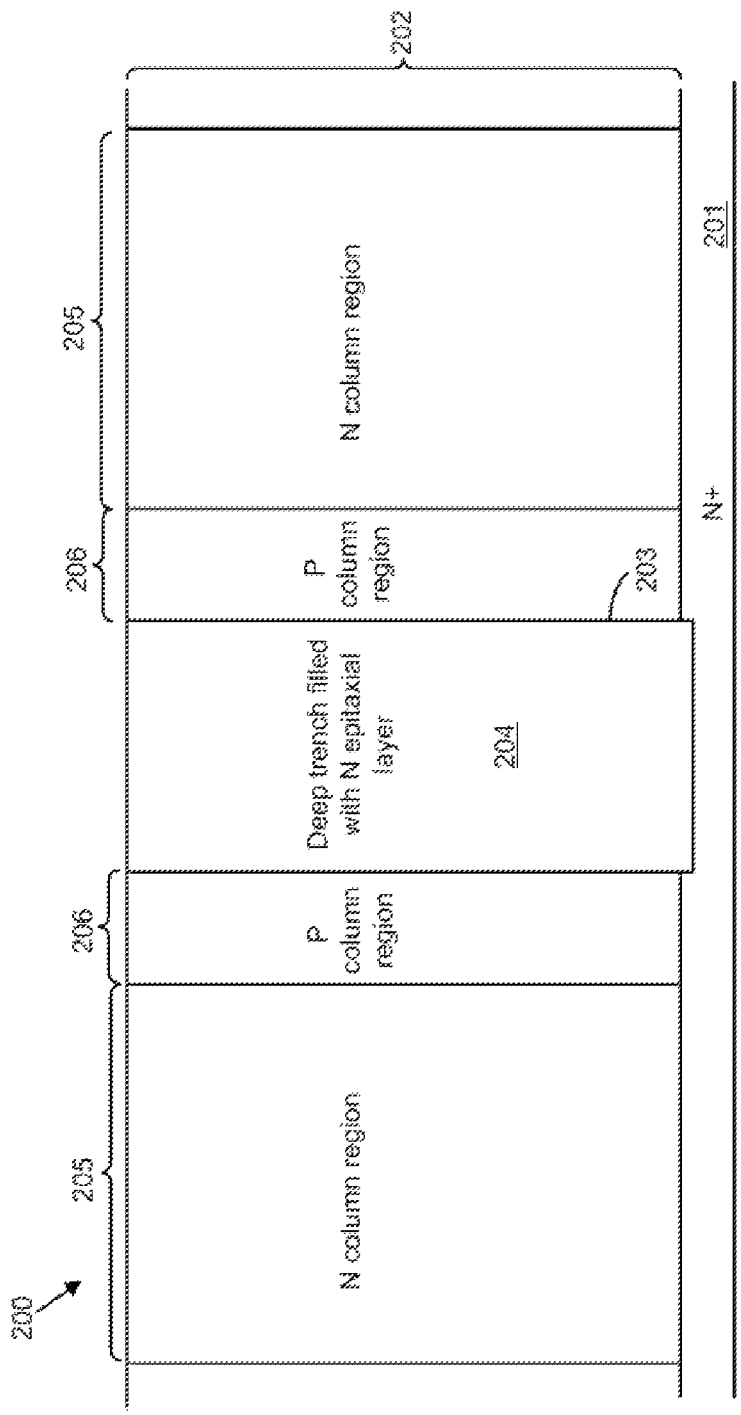
FIG. 2 is a cross-sectional view of a preferred embodiment according to the present invention.

Please refer to FIG. 2 for a preferred embodiment of this invention, wherein a super junction structure 200 formed in a first N epitaxial layer 202 onto an N+ substrate layer 201 is disclosed. According to the present invention, the super junction structure 200 comprises a deep trench 203 penetrating through the first N epitaxial layer 202 and extending into the N+ substrate layer 201, which means the deep trench 203 has a bottom lower than interface between the first N epitaxial layer 202 and the N+ substrate 201. Into the deep trench 203, a second N epitaxial layer 204 is formed refilling the deep trench. A first type N column regions 205 and a second type P column regions 206 are formed in parallel in the first N epitaxial layer 201, wherein, the second type P column regions 206 surrounding the deep trench 203 are located between the first type N column regions 205 and the deep trench 203. The inventive super junction structure can be used for semiconductor power devices such as: MOSFET and Schottky diode.

Figure 3:
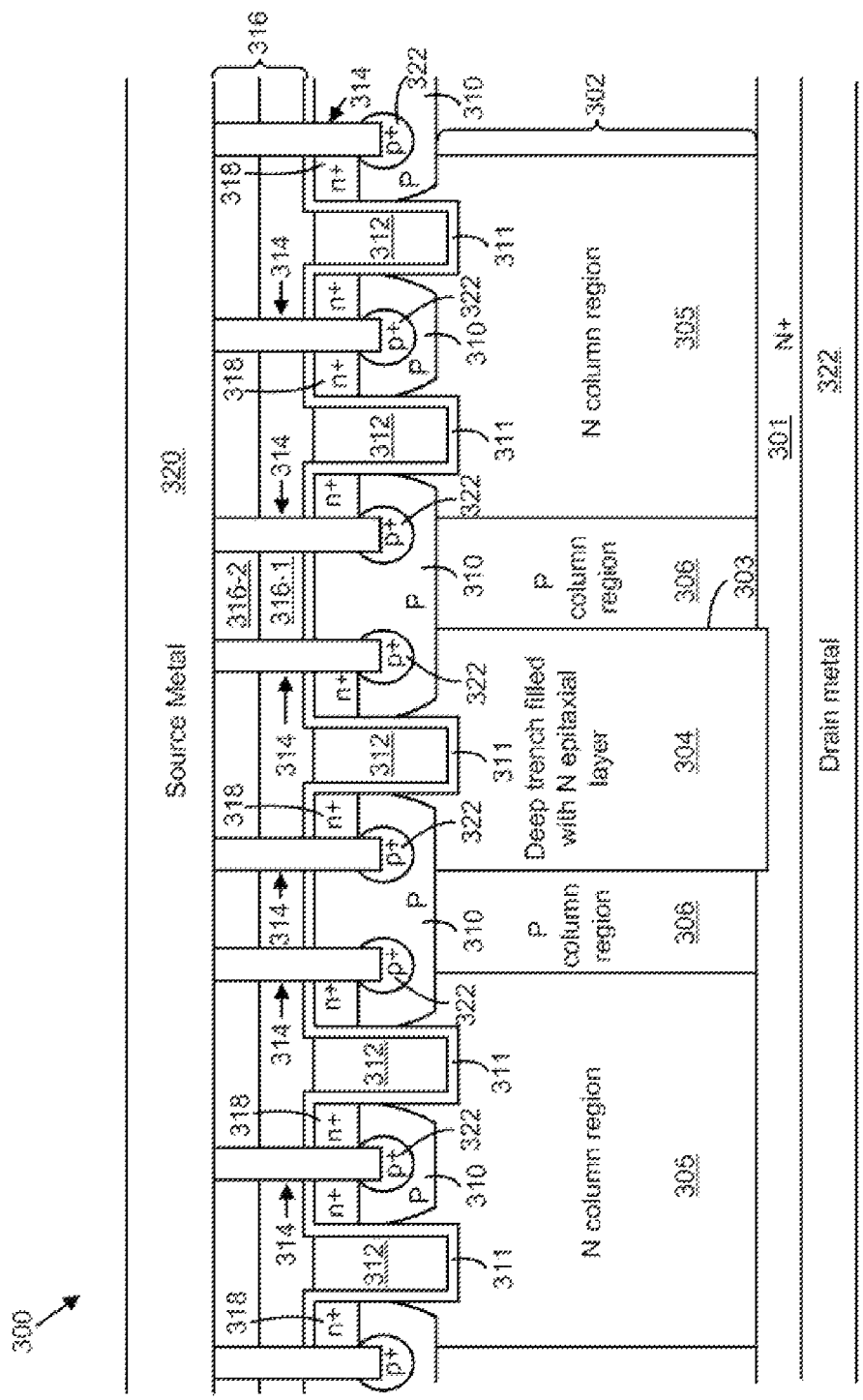
FIG. 3 is a cross-sectional view of another preferred embodiment according to the present invention.

FIG. 3 shows a cross-sectional view of a preferred super junction trench MOSFET (STM) according to the present invention, wherein a super junction structure which is similar to FIG. 2 is integrated with an N-channel trench MOSFET 300. Wherein the super junction structure comprising a second N epitaxial layer 304 in a deep trench 303 is formed in a first N epitaxial layer 302 which comprises a first type N column regions 305 and a second type P column regions 306. P body regions 310 are extending onto the super junction structure and are spaced apart from each other by a plurality of trenched gates 312 which are extending into the first type N column regions 305 and the second N epitaxial layer 304. Between every two adjacent of the trenched gates 312, at least one trenched source-body contact structure 314 is penetrating through a contact interlayer 316 and extending into the P body regions 310. A plurality of n+ source regions 318 are formed surrounding the trenched gates 312 and only located between sidewalls of the trenched gates 312 and the adjacent trenched source-body contact structure 314. Therefore, the n+ source regions 308 and the P body regions 310 are connected to a source metal 320 via the trenched source-body contact structure 314 which is filled with a contact metal plug (not shown). A p+ ohmic body doped region 322 is formed surrounding at least bottom of each the trenched source-body contact structure 314 to reduce the contact resistance between the P body regions 310 and the contact metal plug filled in the trenched source-body contact structure 314. A drain metal 322 is formed on a bottom surface of the N+ substrate layer 301. More preferred, the trenched gates 312 can be implemented by a doped polysilicon layer padded by a gate oxide layer 311; the contact interlayer 316 can be implemented by a BPSG (Boron Phosphorus Silicon Glass) layer 316-1 and a NSG (non-doped Silicon Glass) layer 316-2; the contact metal plug formed in the trenched source-body contact structure 314 can be implemented by using a tungsten plug padded by a barrier layer of Ti/TiN or Co/TiN or Ta/TiN; the source metal 320 can be padded by a resistance-reduction layer (not shown) to reduce the contact resistance between the source metal 320 and the contact metal plug formed in the trenched source-body contact structure 314.

Figure 4:
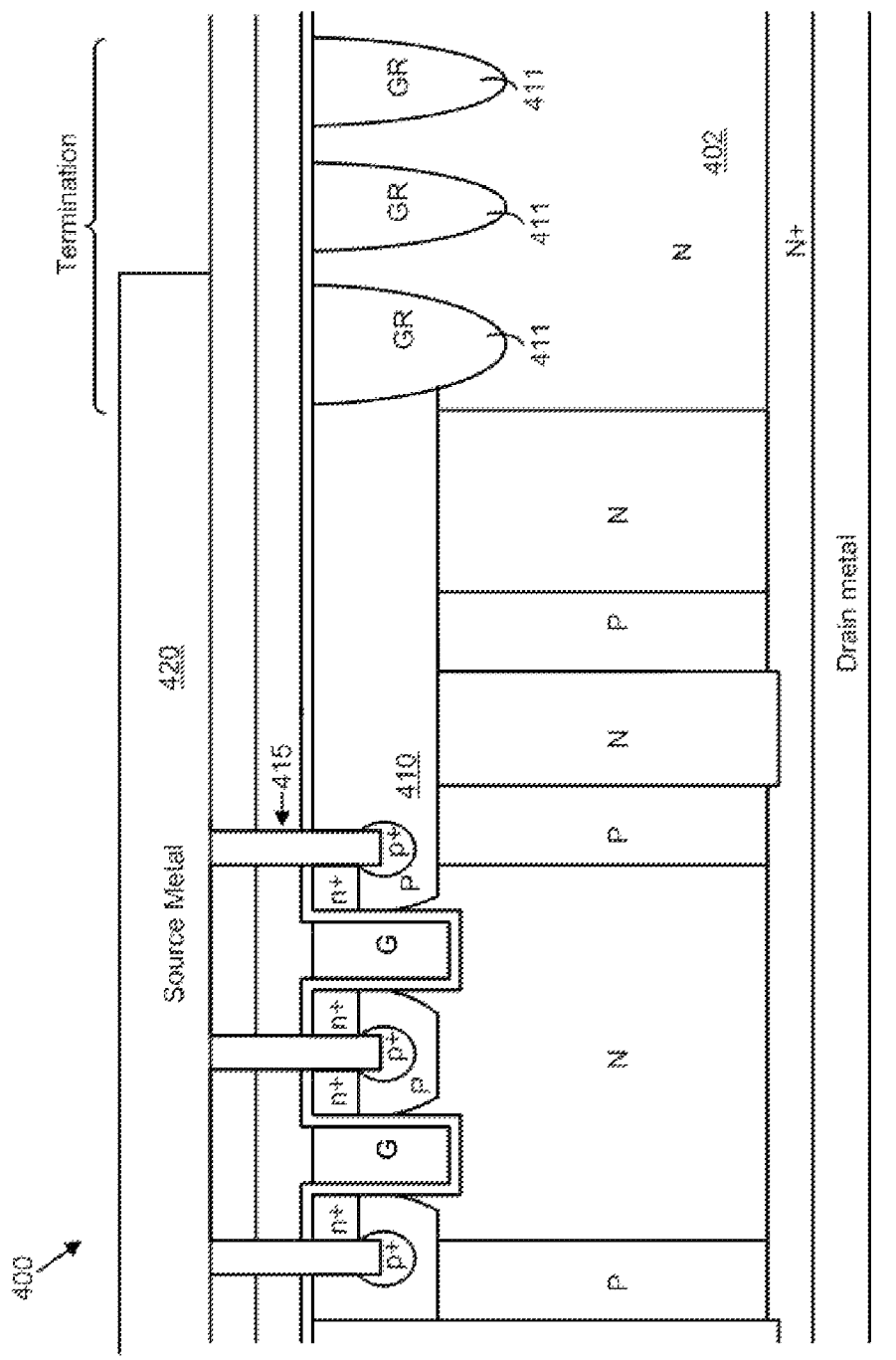
FIG. 4 is a cross-sectional view of another preferred embodiment according to the present invention.

FIG. 4 shows a cross-sectional view of another preferred N-channel trench MOSFET 400 integrated with a super junction structure according to the present invention, compared to FIG. 3, FIG. 4 further comprises a termination structure including multiple guard rings 410 formed near top surface of the first N epitaxial layer 402, wherein one of the guard rings 411 nearest to the P body region 410 is contacting with the P body region 410 and is connected to the source metal 420 via a trenched body contact structure 415. The source metal 420 further extends to cover a portion of the guard rings to function as a field plate.

Figure 5:
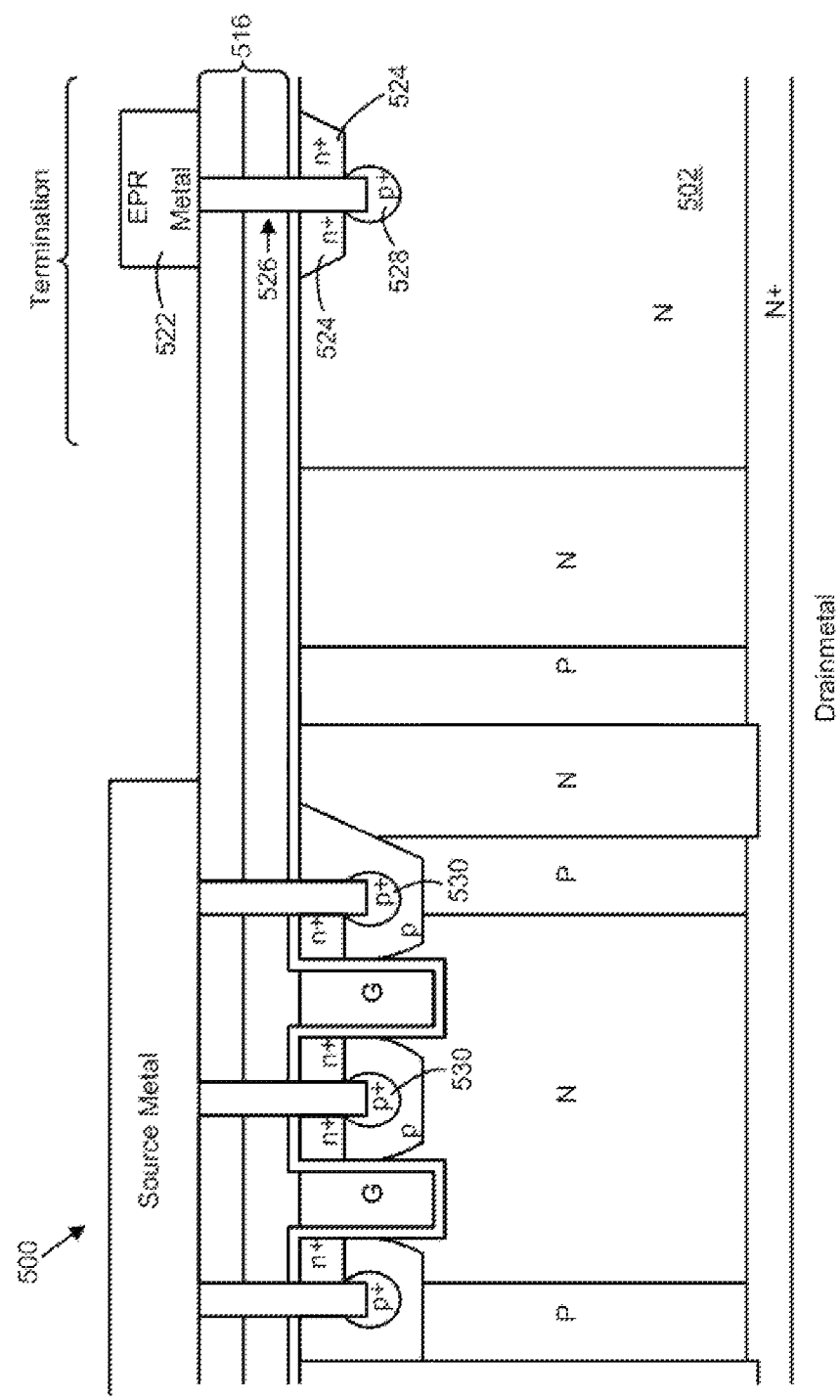
FIG. 5 is a cross-sectional view of another preferred embodiment according to the present invention.

FIG. 5 shows a cross-sectional view of another preferred N-channel trench MOSFET 500 integrated with a super junction structure according to the present invention, compared to FIG. 3, FIG. 5 further comprises a charge balance termination structure including an EPR 522 onto the contact interlayer 516, and an n+ channel stop region 524 near top surface of the first N epitaxial layer 502. Wherein the first N epitaxial layer 502 is shorted to the EPR metal 522 via a trenched EPR contact 526 which has sidewalls surrounded by the n+ channel stop region 524 in the first N epitaxial layer 502 and has a bottom surrounded by a p+ doped region 528 which are formed at the same step with the p+ ohmic body doped regions 530.

Figure 6A:
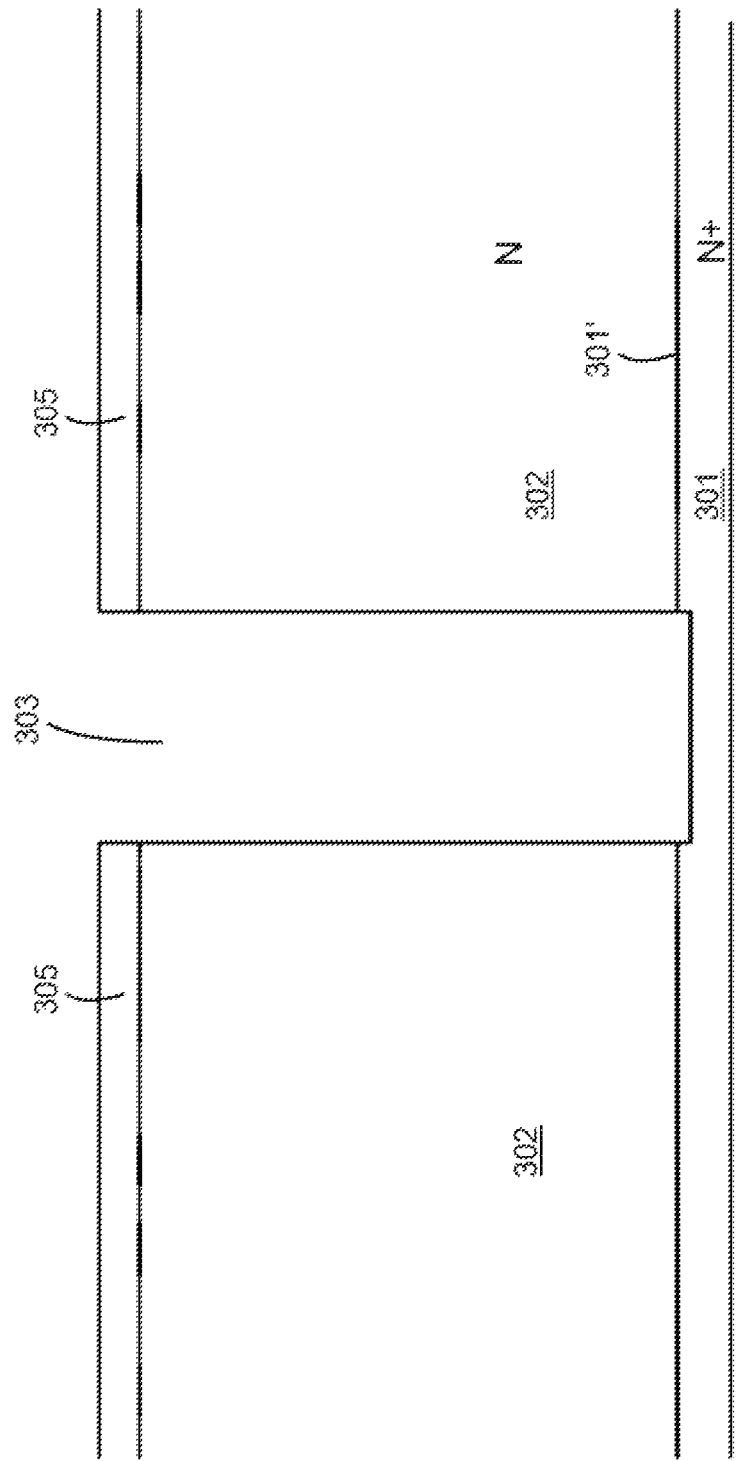

FIGS. 6A to 6J are a serial of exemplary steps that are performed to form the preferred embodiment as shown in FIG. 3. In FIG. 6A, a first N epitaxial layer 302 is grown on an N+ substrate layer 301, wherein the N+ substrate layer 301 has a greater doping concentration than the first N epitaxial layer 302, and shares a common interface 301' with the first N epitaxial layer 302. Next, a deep trench mask 305 is applied covering top surface of the first N epitaxial layer 302, and a deep trench 303 is etched through the deep trench mask 305, the first N epitaxial layer 302 and extending into the N+ substrate layer 301 by successively dry oxide etch and dry silicon etch. Therefore, the deep trench 303 has a bottom lower than the common interface 301'.

Figure 6B:
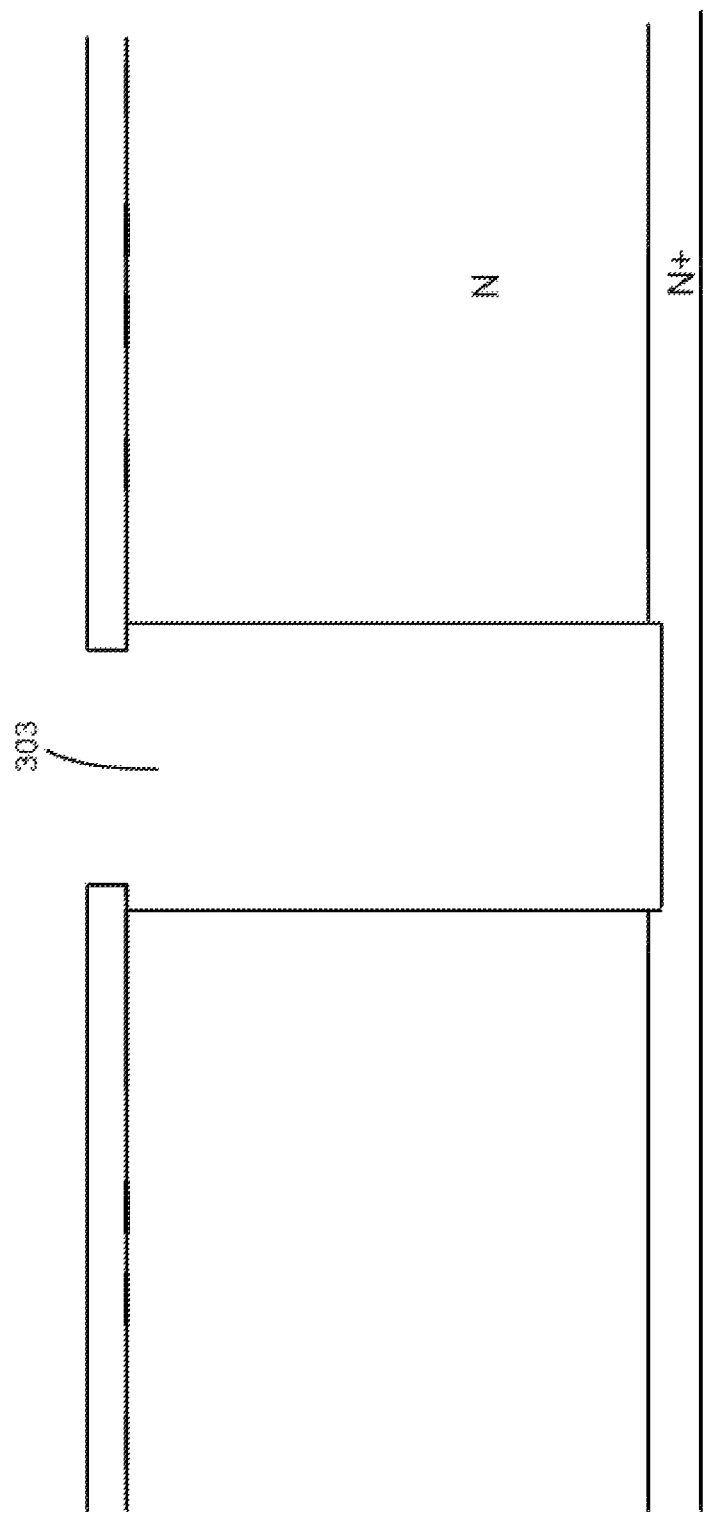

In FIG. 6B, an isotropic dry etch about 500 Å per side is carried out in down stream plasma to remove the silicon damage during opening the deep trench 303.

In FIG. 6C, a pad oxide 307 about 100 Å is first grown lining inner surface of the deep trench 303. Next, angle ion implantations with Phosphorus dopant are carried out through sidewalls of the deep trench 303, and followed by a Phosphorus dopant drive-in for formation of a first type N column regions 305.

Figure 6D:
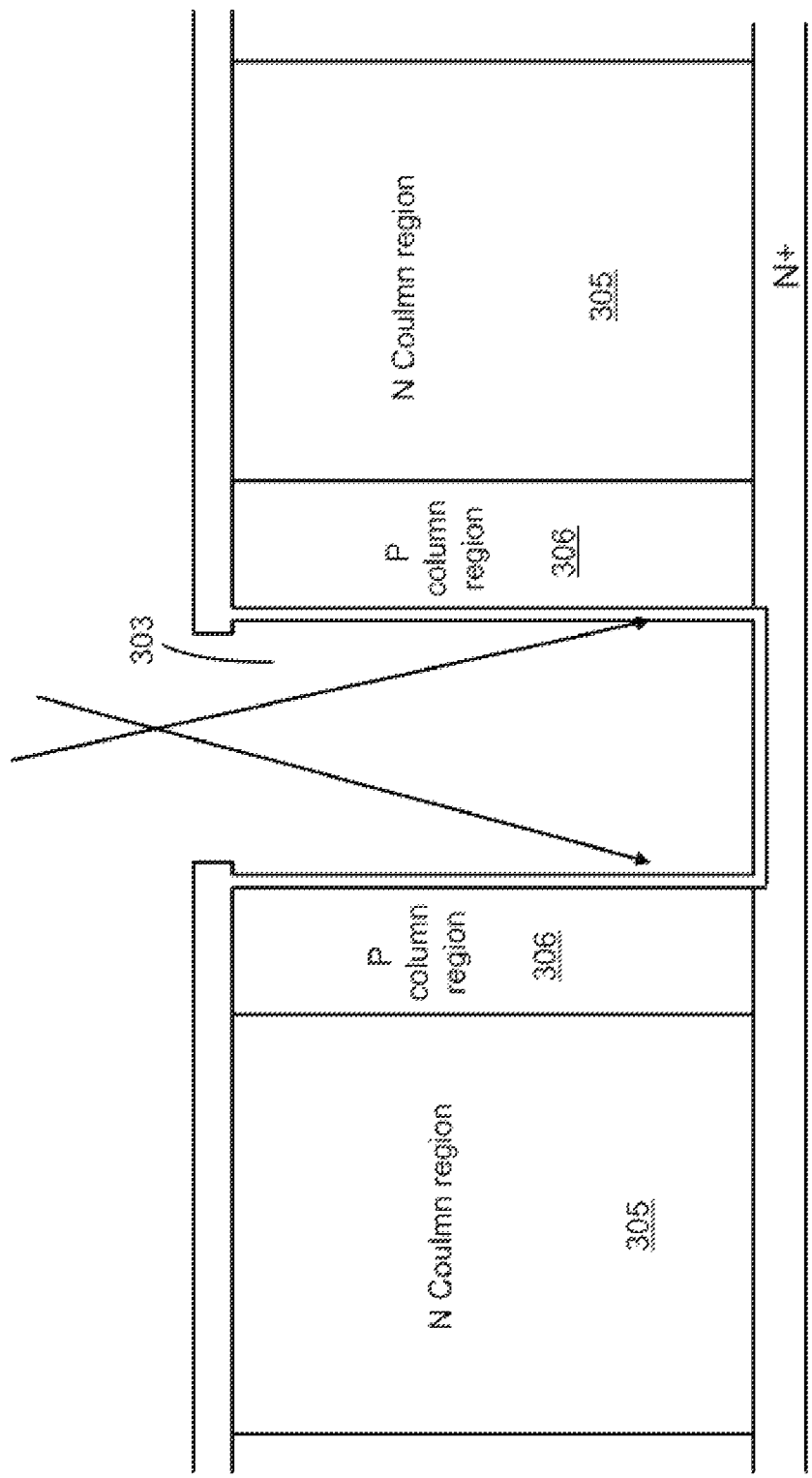

In FIG. 6D, another angle ion implantations with Boron dopant are carried out through sidewalls of the deep trench 303, and followed by a diffusion step for formation of a second type P column regions 306, which is adjacent to the first type N column regions 305 and surrounding sidewalls of the deep trench 303.

Figure 6E:
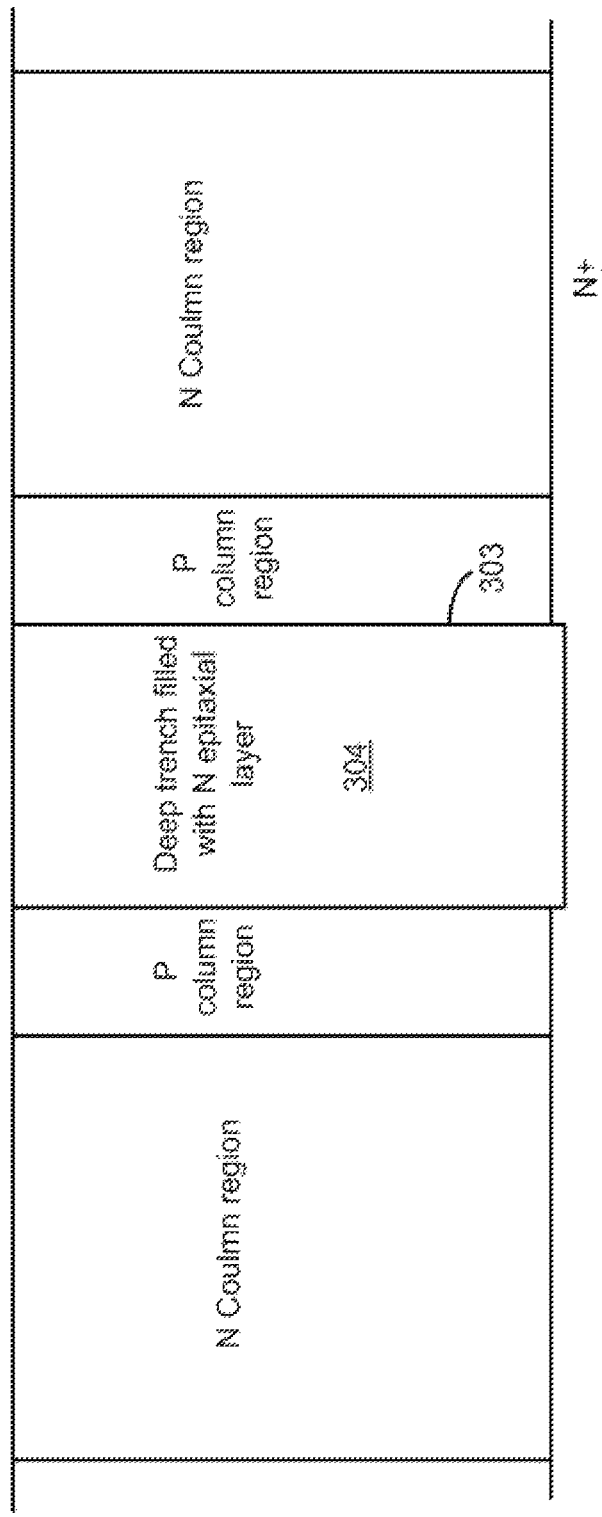

In FIG. 6E, the deep trench mask is first removed, and a second N epitaxial layer 304 is formed and is then etched by CMP to leave necessary portion filling into the deep trench 303.

Figure 6F:
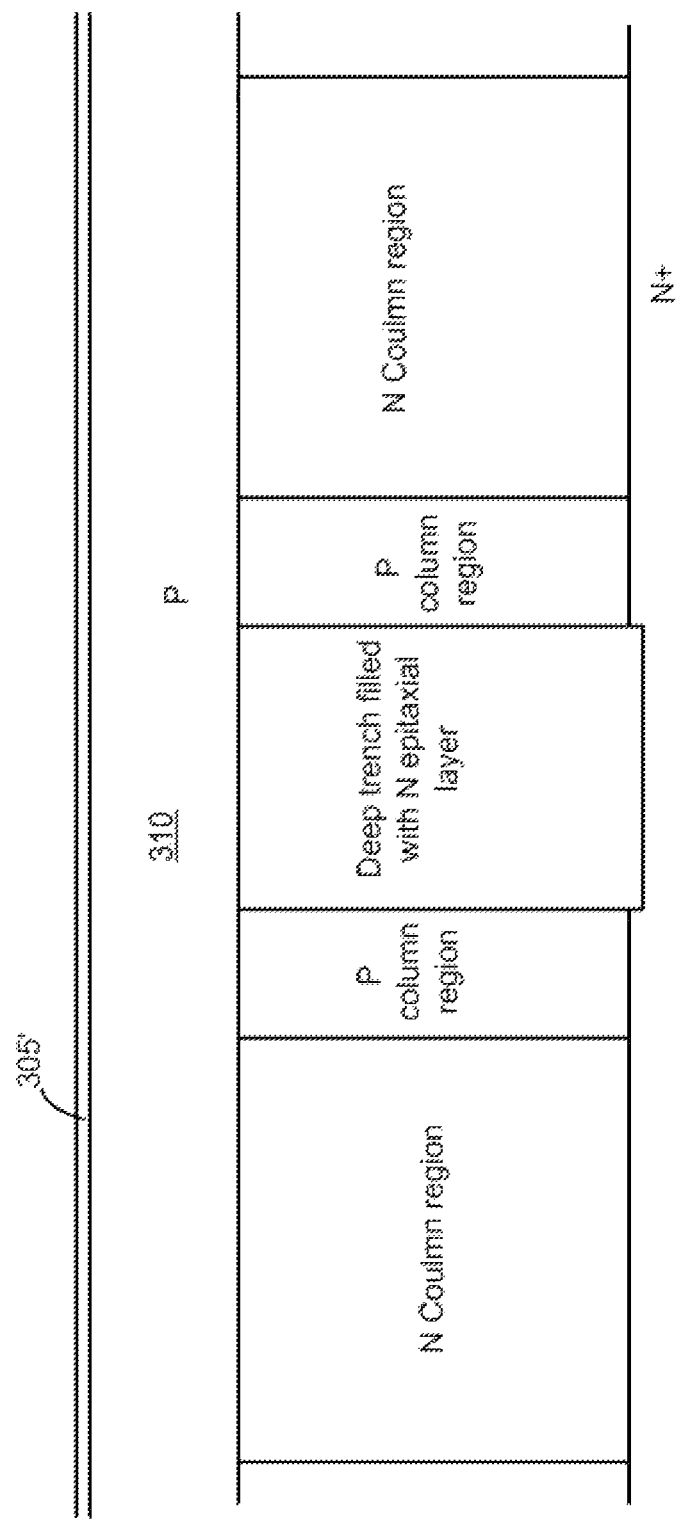

In FIG. 6F, a body mask 305' is first applied covering top surface of the super junction structure in FIG. 6E, then an ion implantation with P body dopant is carried out and followed by a diffusion step to form P body regions 310.

Figure 6G:
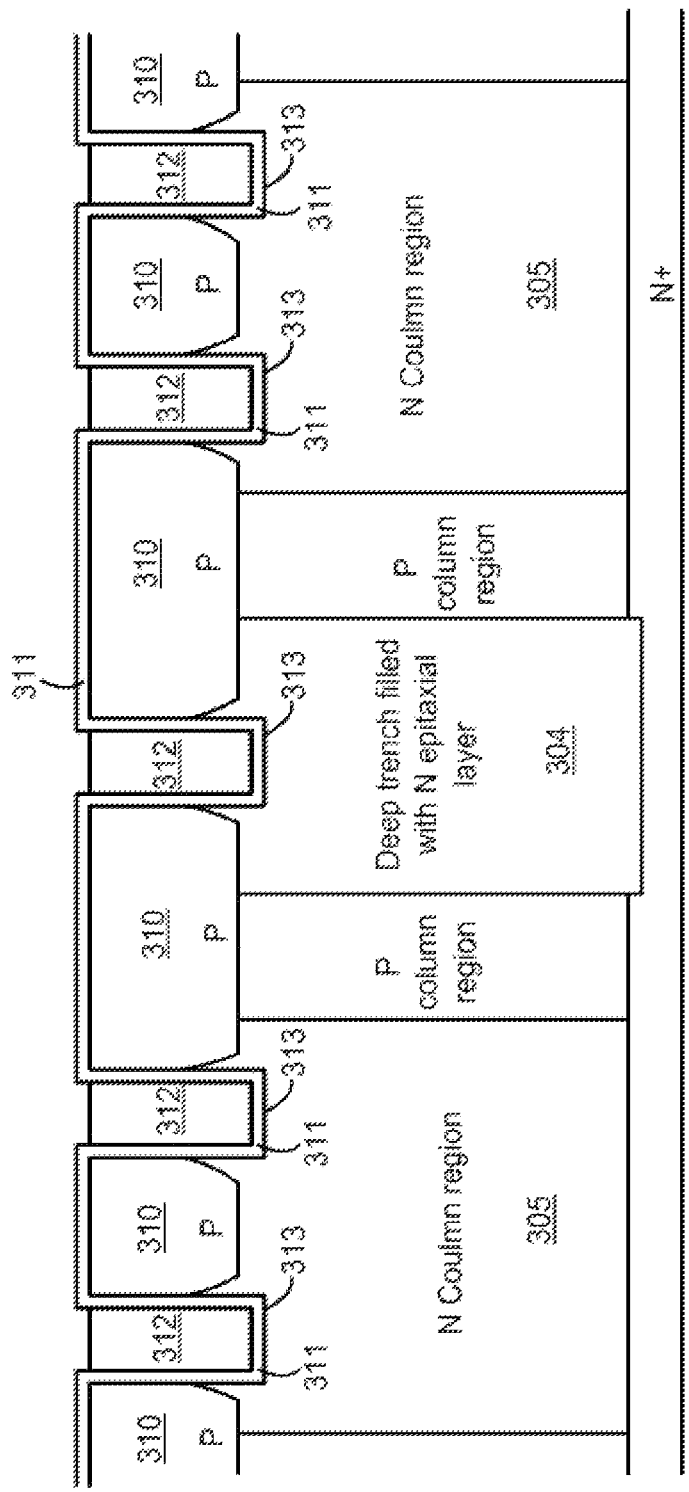

In FIG. 6G, after the body mask 305' is removed, a gate mask (not shown) is applied for etching a plurality of gate trenches 313 which are some extending into the first type N column regions 306 and some extending into the second N epitaxial layer 304. Then a sacrificial oxide layer is grown and then removed to eliminate the silicon damage during opening those gate trenches 313. Next, a gate oxide layer 311 is formed along inner surface of the gate trenches 313 and onto top surface of the P body regions 310. Then, a doped poly-silicon layer is deposited onto the gate oxide layer 311 and is then etched to leave necessary portion in the gate trenches 313 to form a plurality of trenched gates 312.

Figure 6H:
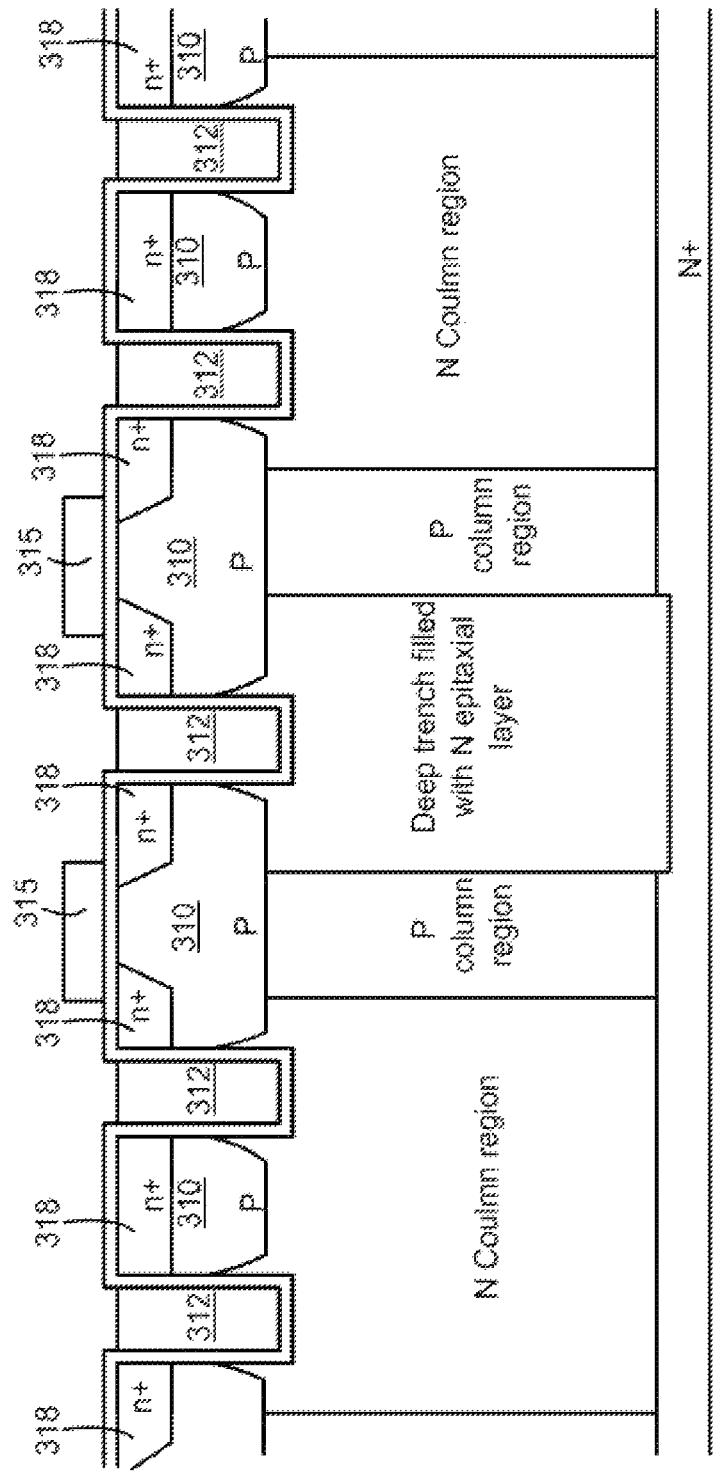

In FIG. 6H, a source mask 315 is first applied for a source ion implantation with source dopant, then a source dopant diffusion step is carried out for formation of a plurality of n+ source regions near top surface of the P body regions 310 and surrounding the trenched gates 312.

Figure 6I:
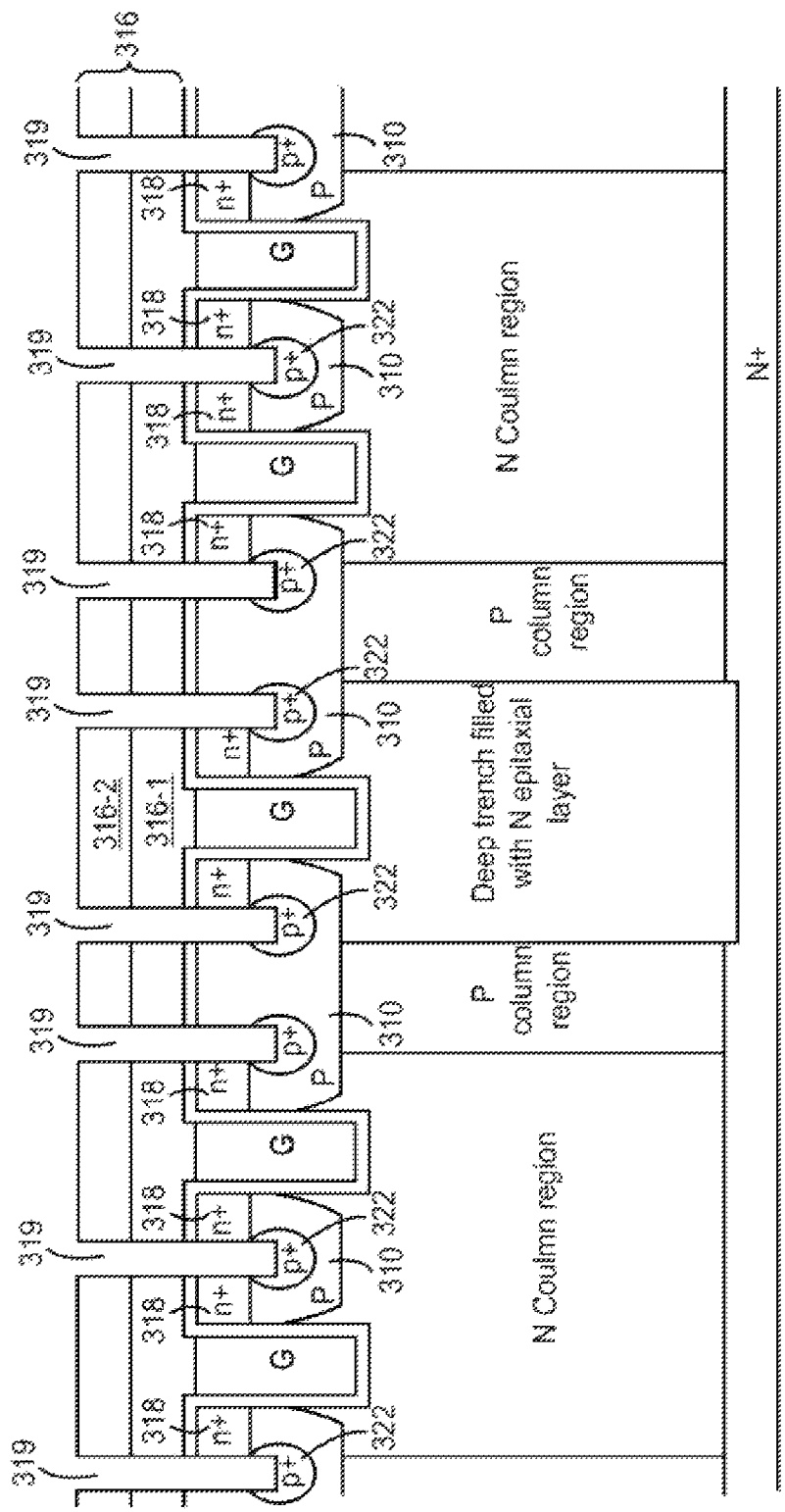

In FIG. 6I, after the source mask 315 is removed, a BPSG layer 316-1 and an NSG layer 316-2 are successively deposited to act as a contact interlayer 316. Then, a contact mask (not shown) is applied for etching a plurality of contact openings 319 by successively dry oxide etch and dry silicon etch, wherein the contact openings 319 are penetrating through the contact interlayer 316 and extending into the P body regions 310. What should be noticed is that, the n+ source regions 318 are only located between the contact openings 319 and the adjacent trenched gates 312, not between two adjacent contact openings 319. Next, a BF2 ion implantation is performed to form a p+ ohmic body doped region in the P body regions 310 and surrounding at least bottom of each of the contact openings 319. After that, a step of RTA (Rapid Thermal Annealing) is performed.

Figure 6J:
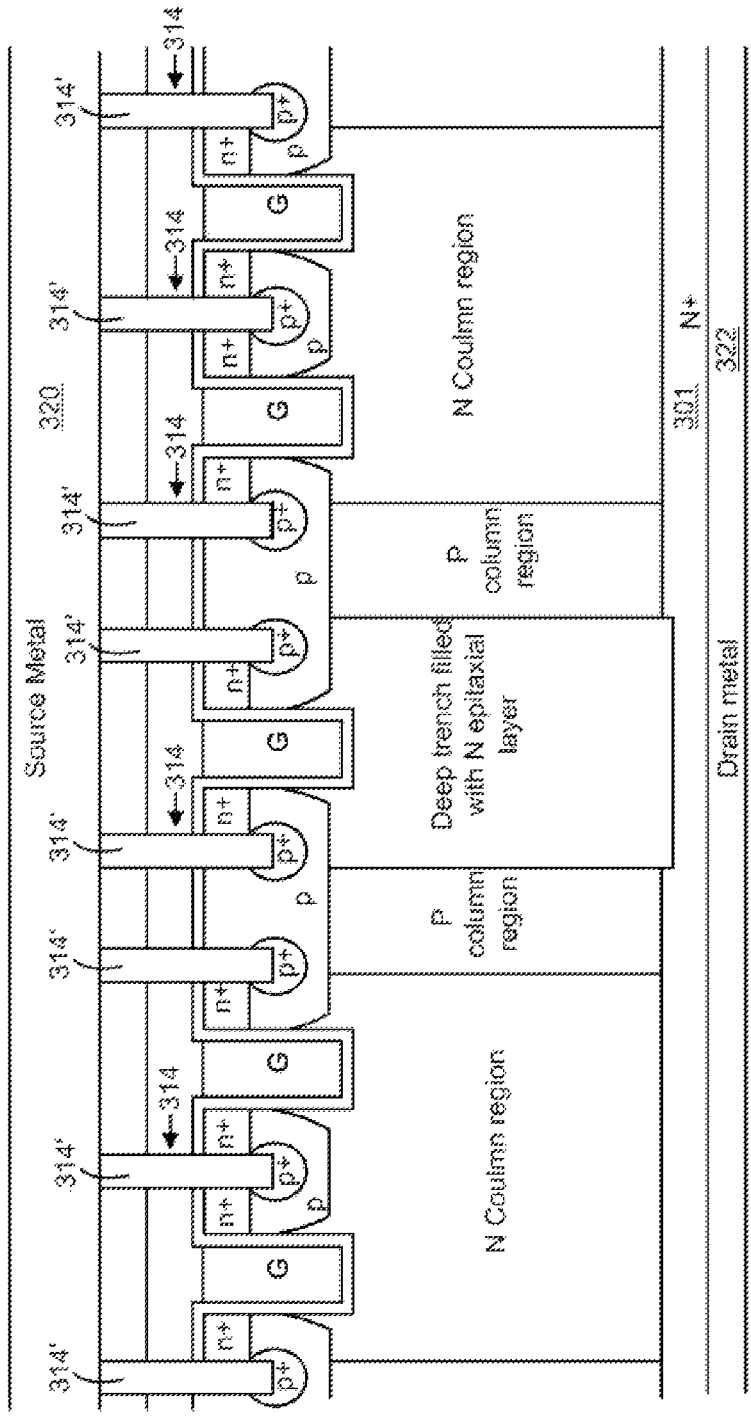

In FIG. 6J, a layer of Ti/TiN or Co/TiN or Ta/TiN (not shown) and material tungsten are successively deposited and then etched back to leave necessary portion in the contact openings 319 (as shown in FIG. 6I) to act as a contact metal plug 314' for a trenched source-body contact structure 314. Then, metal Al alloys padded by a Ti or Ti/TiN layer (not shown) is deposited and is then patterned after applying a metal mask (not shown) by metal etch to form a source metal 320. Next, a drain metal 322 is deposited on a bottom surface of the N+ substrate layer 301 after backside grinding.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A method for manufacturing a super junction trench MOSFET comprising the steps of:

growing a first epitaxial layer structure of a first conductivity type upon a heavily doped substrate layer of said first conductivity type;

forming a deep trench mask covering a top surface of said first epitaxial layer;

applying a trench mask to form a deep trench structure extending into said substrate layer by successively dry oxide etch and dry silicon etch;

carrying out angle ion implantations of said first conductivity type dopant and driving-in to form a first type column structures with column shape within said first epitaxial layer;

carrying out angle ion implantations of a second conductivity type dopant and diffusion to form a second type column structures with column shape adjacent to sidewalls of said deep trench structure, in parallel with and surrounding said first type column structures; removing said deep trench mask;

forming a second epitaxial layer of said first conductivity type into said deep trench structure;

applying a body mask and carrying out body ion implantation over the above said structures to form body regions;

applying a gate mask to etch a plurality of gate trenches through said body regions and extending into said first type column structures and said second epitaxial layer;

growing a sacrificial oxide layer onto inner surface of said gate trenches and remove to eliminate the plasma damage;

growing a gate oxide layer along an inner surface of said gate trenches;

depositing a doped poly-silicon layer to fill said gate trenches;

etching back said doped poly-silicon layer by CMP or plasma etch to serve as a plurality of trenched gates;

applying a source mask and carrying out source ion implantation;

depositing a contact interlayer; and applying a contact mask and etching a plurality of contact openings through said contact interlayer and extending into said body regions, wherein source regions are located only between each of said contact openings and an adjacent trenched gate.

2. The method of claim 1, after etching said deep trench, further comprising isotropic dry etch about 500 Å in downstream plasma to remove silicon damage during etching said deep trench.

3. The method of claim 1, before carrying out angle ion implantation of said first conductivity type dopant, further comprising growing a pad oxide about 100 Å along inner surface of said deep trench.

* * * * *